(12) United States Patent
Shibayama et al.

(10) Patent No.: US 9,509,282 B2
(45) Date of Patent: Nov. 29, 2016

(54) DIGITAL FILTER CIRCUIT AND DIGITAL FILTER PROCESSING METHOD

(71) Applicants: Atsufumi Shibayama, Tokyo (JP); Junichi Abe, Tokyo (JP)

(72) Inventors: Atsufumi Shibayama, Tokyo (JP); Junichi Abe, Tokyo (JP)

(73) Assignee: NEC CORPORATION, Tokyo (JP)

( * ) Notice: Subject to any disclaimer, the term of this patent is extended or adjusted under 35 U.S.C. 154(b) by 253 days.

(21) Appl. No.: 14/364,774

(22) PCT Filed: Oct. 26, 2012

(86) PCT No.: PCT/JP2012/077716
§ 371 (c)(1),
(2) Date: Jun. 12, 2014

(87) PCT Pub. No.: WO2013/094308
PCT Pub. Date: Jun. 27, 2013

(65) Prior Publication Data
US 2014/0379771 A1    Dec. 25, 2014

(30) Foreign Application Priority Data
Dec. 20, 2011 (JP) ................. 2011-278254

(51) Int. Cl.
*H03H 17/02* (2006.01)
(52) U.S. Cl.
CPC ..... *H03H 17/0213* (2013.01); *H03H 17/0202* (2013.01); *H03H 17/0248* (2013.01); *H03H 2218/04* (2013.01)
(58) Field of Classification Search
CPC ................................. H03H 17/0213
See application file for complete search history.

(56) References Cited

U.S. PATENT DOCUMENTS

| | | | | | |
|---|---|---|---|---|---|
| 3,679,882 A | * | 7/1972 | McAuliffe | ......... | H03H 17/0213 708/323 |
| 5,270,953 A | * | 12/1993 | White | ................ | G06F 17/142 708/321 |

(Continued)

FOREIGN PATENT DOCUMENTS

| JP | 2005-65231 A | 3/2005 |
|---|---|---|
| JP | 2008-17511 A | 1/2008 |

(Continued)

OTHER PUBLICATIONS

International Search Report for Pot Application No. PCT/JP2012/077716, mailed on Jan. 29, 2013.

*Primary Examiner* — Chuong D Ngo (57) ABSTRACT

A digital filter circuit includes an FFT circuit (13) that transforms a complex signal in a time domain into a signal in a frequency domain, an I/Q separation circuit (15) that separates the signal in the frequency domain into a signal in a first frequency domain that corresponds to the real part of the complex signal in the time domain, and a signal in a second frequency domain that corresponds to the imaginary part of the complex signal in the time domain, a filter circuit (21) that performs filter processing on the signal in the first frequency domain, a filter circuit (22) that performs filter processing on the signal in the second frequency domain, an I/Q combination circuit (16) that combines an output from the filter circuit (21) and an output from the filter circuit (22) to generate a signal in a third frequency domain, a filter circuit (23) that performs filter processing on the signal in the third frequency domain, and an IFFT circuit (14) that transforms an output signal from the filter circuit (23) into a signal in the time domain.

9 Claims, 8 Drawing Sheets (56) References Cited

U.S. PATENT DOCUMENTS

5,768,165 A * 6/1998 Palicot ............... H03H 17/0664
348/614
2003/0005008 A1 * 1/2003 Gray ................. H03H 17/0213
708/300

FOREIGN PATENT DOCUMENTS

| JP | 2009-272683 A | 11/2009 |
| JP | 2010-219582 A | 9/2010 |
| JP | 2011-4264 A | 1/2011 |

* cited by examiner

DIGITAL FILTER CIRCUIT AND DIGITAL FILTER PROCESSING METHOD

This application is a National Stage Entry of PCT/JP2012/077716 filed on Oct. 26, 2012 which claims priority from Japanese Patent Application 2011-278254 filed on Dec. 20, 2011, the contents of all which are incorporated herein by reference, in their entirety.

TECHNICAL FIELD

The present invention relates to an arithmetic processing circuit in digital signal processing and, more particularly, to a digital filter circuit.

BACKGROUND ART

Figure 9:
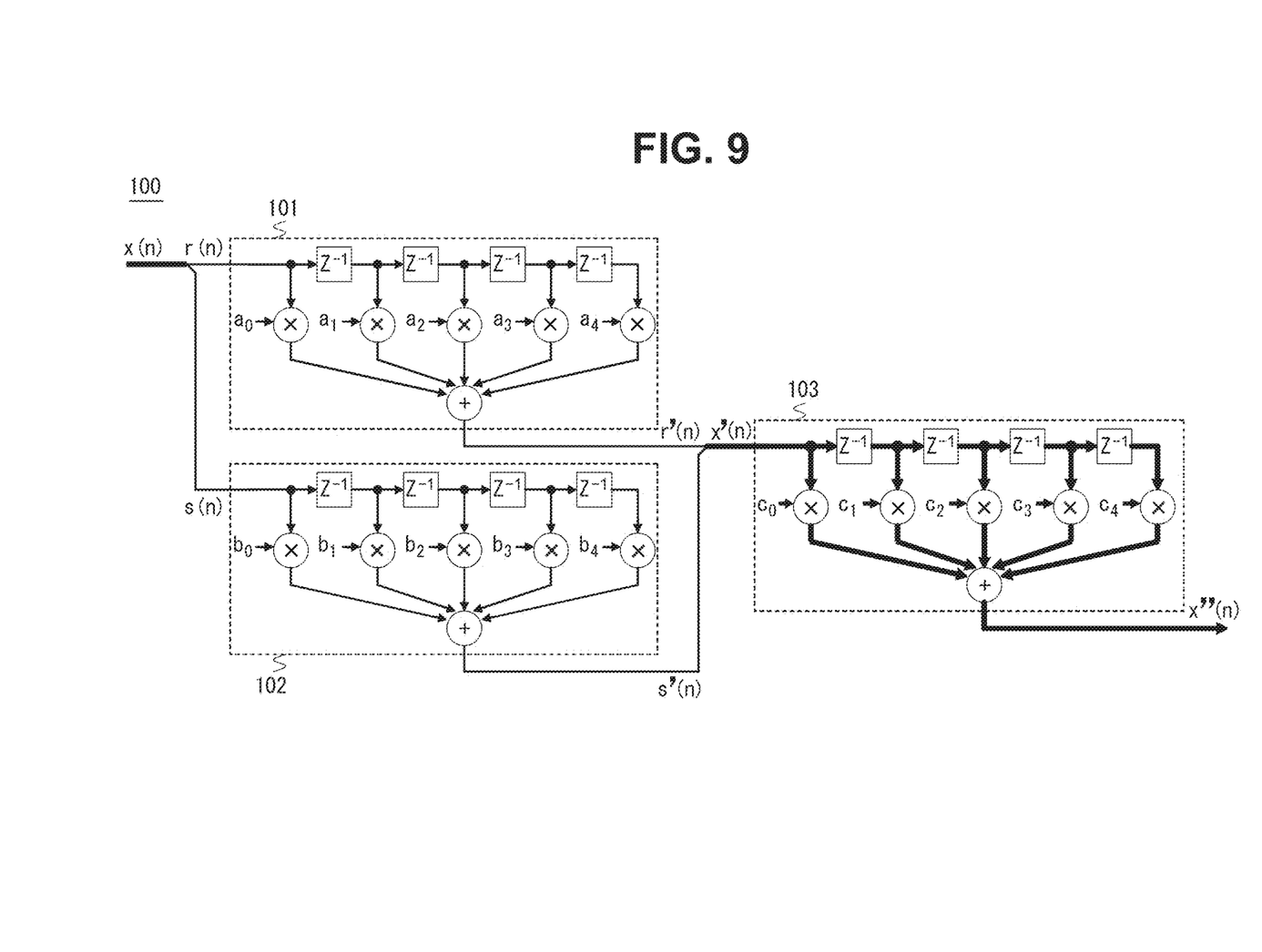
FIG. 9 is a block diagram showing the arrangement of a digital filter circuit according to a related art.

Recently, an FIR filter (Finite Impulse Response filter) and IIR filter (Infinite Impulse Response filter) are popularly used as digital filters. FIG. 9 is a block diagram showing an example of the arrangement of a digital filter circuit 100 using an FIR filter. In FIG. 9, a real signal is indicated by a solid line, and a complex signal is indicated by a thick line to discriminate them. This notation also applies to the remaining drawings.

The digital filter circuit 100 is a digital filter circuit that performs filter processing in the time domain for a complex signal $x(n)=r(n)+js(n)$ (j is an imaginary unit, n is an integer). The digital filter circuit 100 includes three FIR filters 101, 102, and 103.

The FIR filter 101 is a 5-tap real-coefficient FIR filter that performs filter processing by real number calculation on a real signal r(n) serving as the real part of the input complex signal x(n). Five filter coefficients a0 to a4 of the FIR filter 101 are real numbers. The FIR filter 101 outputs the result of filter processing as a real signal r'(n).

Similarly, the FIR filter 102 is a 5-tap real-coefficient FIR filter that performs filter processing by real number calculation on a real signal s(n) serving as the imaginary part of the input complex signal. Five filter coefficients b0 to b4 of the FIR filter 102 are real numbers. The FIR filter 102 outputs the result of filter processing as a real signal s'(n).

In contrast, the FIR filter 103 is a 5-tap complex-coefficient FIR filter that performs filter processing by complex number calculation on a complex signal $x'(n)=r'(n)+js'(n)$ formed from the real signals r'(n) and s'(n) having undergone filter processing by the FIR filters 101 and 102. Five filter coefficients c0 to c4 of the FIR filter 103 are complex numbers. The FIR filter 103 outputs the result of filter processing as a complex signal x"(n).

Filter processing by the FIR filter includes filter processing to be performed by real number calculation using filter coefficients of real numbers, and filter processing to be performed by complex number calculation using filter coefficients of complex numbers, as in the digital filter circuit 100.

In general, the minimum value of the number of taps of an FIR filter is decided by the impulse response length of a filter function to be implemented. In some cases, several hundred taps or more are necessary to implement a complicated filter function. When an FIR filter with a large number of taps is mounted in an LSI, the circuit scale and power consumption of the LSI may increase greatly.

To solve this problem, Japanese Patent Laid-Open No. 2011-4264 has disclosed a technique of performing filter processing in the frequency domain. In filter processing in the frequency domain, signal data in the time domain is temporarily transformed into signal data in the frequency domain by fast Fourier transform (FFT). Then, filter calculation of signal data and a filter coefficient is executed in the frequency domain. The signal data having undergone the filter processing is retransformed into signal data in the time domain by inverse fast Fourier transform (IFFT).

When the number of taps of the FIR filter is large, the circuit scale and power consumption necessary to implement filter processing can be reduced by performing filter processing in the frequency domain. This is because convolution calculation in the time domain by the FIR filter can be converted into simple multiplication in the frequency domain.

When transforming complex signal data in the time domain into complex signal data in the frequency domain by complex FFT, the real part and imaginary part of complex signal data in the time domain are combined and transformed in complex signal data in the frequency domain. Thus, according to the technique disclosed in Japanese Patent Laid-Open No. 2011-4264, when performing filter processing independently on the real part and imaginary part of a complex signal, the respective real and imaginary parts of the complex signal need to be independently transformed into real signal data in the frequency domain by real FFT.

Figure 10:
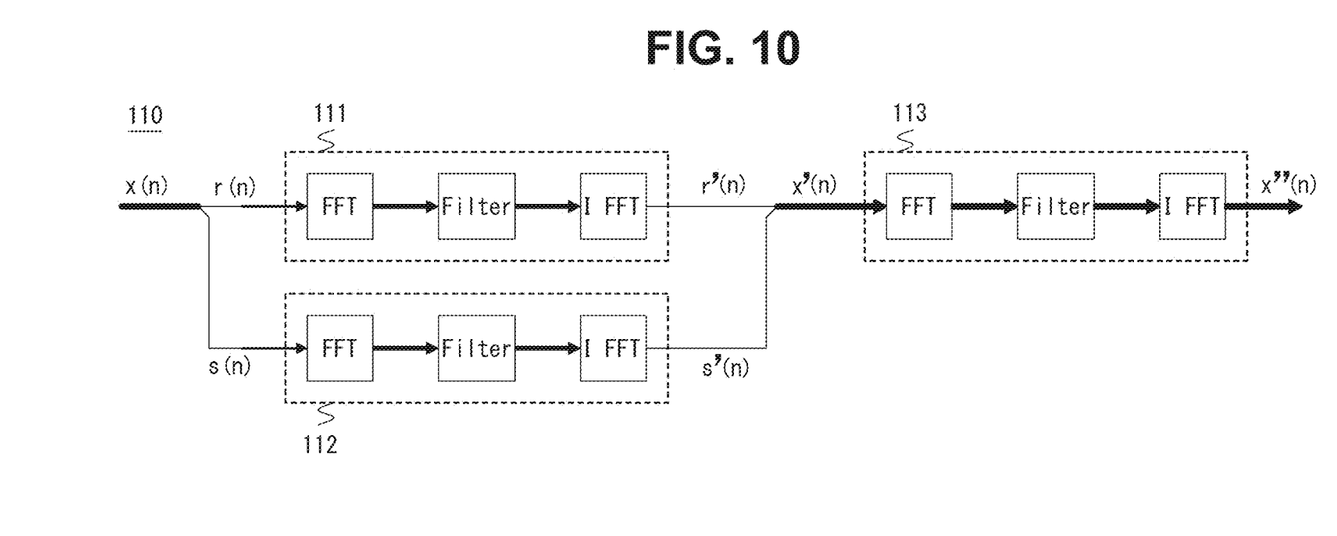
FIG. 10 is a block diagram showing the arrangement of another digital filter circuit according to the related art.

FIG. 10 is a block diagram of a digital filter circuit 110 that performs filter processing in the frequency domain according to the technique disclosed in Japanese Patent Laid-Open No. 2011-4264. FIG. 10 shows an example corresponding to the arrangement of the digital filter circuit 100 that performs filter processing in the time domain shown in FIG. 9. The digital filter circuit 110 is a digital filter circuit that performs filter processing in the frequency domain for a complex signal $x(n)=r(n)+js(n)$. The digital filter circuit 110 includes three frequency domain filters 111, 112, and 113.

The frequency domain filter 111 transforms a real signal r(n) serving as the real part of an input complex signal x(n) in the time domain, into complex signal data in the frequency domain by FFT. Then, the frequency domain filter 111 executes filter calculation by complex number calculation on the complex signal data in the frequency domain, and retransforms the complex signal data having undergone filter processing into real signal data r'(n) in the time domain by IFFT. Even when Fourier transform is performed on the real signal r(n), the transformed signal data becomes a complex number. The filter coefficient is also a complex number in general. For this reason, filter calculation requires complex number calculation.

Similarly, the frequency domain filter 112 transforms a real signal s(n) serving as the imaginary part of the input complex signal x(n) in the time domain, into complex signal data in the frequency domain by FFT. Then, the frequency domain filter 112 executes filter calculation by complex number calculation on the complex signal data in the frequency domain, and retransforms the complex signal data having undergone filter processing into real signal data s'(n) in the time domain by IFFT.

To the contrary, the frequency domain filter 113 transforms, into complex signal data in the frequency domain by FFT, a complex signal $x'(n)=r'(n)+js'(n)$ formed from the real signals r'(n) and s'(n) having undergone filter processing by the frequency domain filters 111 and 112. After that, the frequency domain filter 113 executes filter calculation by complex number calculation on the complex signal data in the frequency domain, and retransforms the complex signal data having undergone filter processing into complex signal data x"(n) in the time domain by IFFT.

Note that techniques of performing filter processing in the frequency domain are also disclosed in Japanese Patent Laid-Open Nos. 2005-065231, 2008-017511, and 2009-272683.

DISCLOSURE OF INVENTION

Problem to be Solved by the Invention

As is apparent from the arrangement of the digital filter circuit 110, when performing both a filter process by complex number calculation on a complex signal, and independent filter processes by real number calculation on the respective real and imaginary parts of the complex signal, the frequency domain filter according to the technique disclosed in Japanese Patent Laid-Open No. 2011-4264 requires FFT and IFFT for the respective filter processes. When the digital filter circuit 110 is mounted in an LSI, the circuit scale and power consumption of the LSI greatly increase.

The techniques disclosed in Japanese Patent Laid-Open Nos. 2005-065231, 2008-017511, and 2009-272683 can cope with a case in which filter processing is performed by real number calculation using filter coefficients of real numbers, but cannot cope with a case in which filter processing is performed by complex number calculation using filter coefficients of complex numbers after the filter processing by real number calculation.

The present invention has been made to solve the above problems, and has as its exemplary object to provide a digital filter circuit and digital filter processing method capable of reducing the circuit scale and power consumption in digital filter processing in the frequency domain when the digital filter circuit is mounted in an LSI.

Means of Solution to the Problem

According to the present invention, there is provided a digital filter circuit comprising Fourier transform means for transforming a complex signal in a time domain into a signal in a frequency domain by Fourier transform, I/Q separation means for separating the signal in the frequency domain transformed by the Fourier transform means into a signal in a first frequency domain that corresponds to a real part of the complex signal in the time domain, and a signal in a second frequency domain that corresponds to an imaginary part of the complex signal in the time domain, first filter means for performing filter processing on the signal in the first frequency domain, second filter means for performing filter processing on the signal in the second frequency domain, I/Q combination means for combining the signal having undergone the filter processing by the first filter means and the signal having undergone the filter processing by the second filter means, thereby generating a signal in a third frequency domain, third filter means for performing filter processing on the signal in the third frequency domain, and inverse Fourier transform means for transforming the signal having undergone the filter processing by the third filter means into a signal in the time domain by inverse Fourier transform.

According to the present invention, there is also provided a digital filter processing method comprising a Fourier transform step of transforming a complex signal in a time domain into a signal in a frequency domain by Fourier transform, an I/Q separation step of separating the signal in the frequency domain transformed in the Fourier transform step into a signal in a first frequency domain that corresponds to a real part of the complex signal in the time domain, and a signal in a second frequency domain that corresponds to an imaginary part of the complex signal in the time domain, a first filter step of performing filter processing on the signal in the first frequency domain, a second filter step of performing filter processing on the signal in the second frequency domain, an I/Q combination step of combining the signal having undergone the filter processing in the first filter step and the signal having undergone the filter processing in the second filter step, thereby generating a signal in a third frequency domain, a third filter step of performing filter processing on the signal in the third frequency domain, and an inverse Fourier transform step of transforming the signal having undergone the filter processing in the third filter step into a signal in the time domain by inverse Fourier transform.

Effect of the Invention

The present invention can provide a digital filter circuit and digital filter processing method capable of reducing the circuit scale and power consumption in digital filter processing in the frequency domain when the digital filter circuit is mounted in an LSI. Also, the present invention can cope with a case in which filter processing is performed by complex number calculation using filter coefficients of complex numbers after performing filter processing by real number calculation using filter coefficients of real numbers.

BEST MODE FOR CARRYING OUT THE INVENTION

Exemplary embodiments of the present invention will now be described with reference to the accompanying drawings.

[First Exemplary Embodiment]

Figure 1:
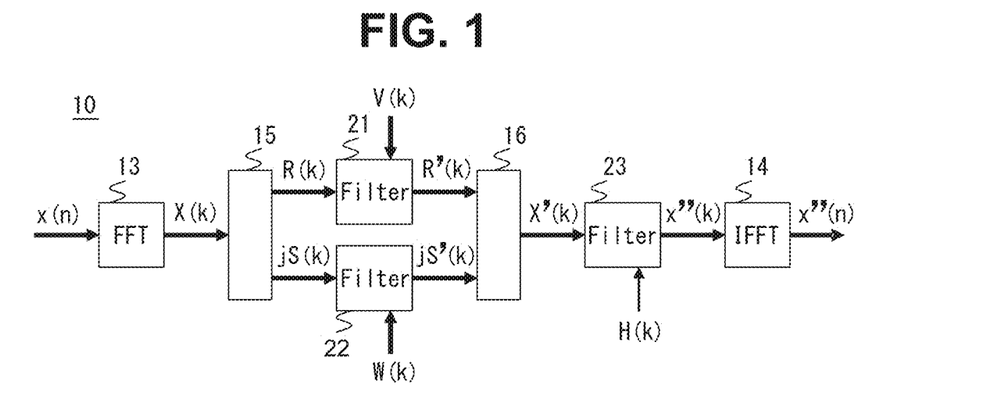
FIG. 1 is a block diagram showing the arrangement of a digital filter circuit according to the first exemplary embodiment of the present invention.
Figure 2:
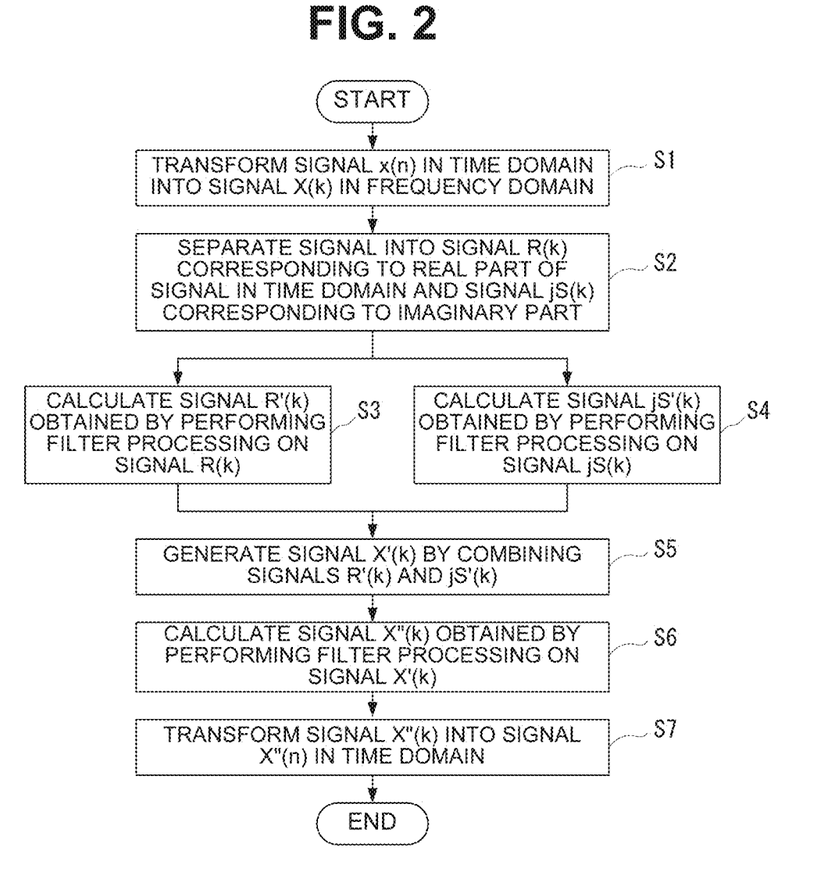
FIG. 2 is a flowchart for explaining the operation of the digital filter circuit according to the first exemplary embodiment of the present invention.

FIG. 1 is a block diagram showing the arrangement of a digital filter circuit 10 according to the first exemplary embodiment of the present invention. FIG. 2 is a flowchart for explaining the operation of the digital filter circuit 10.

The digital filter circuit 10 according to the exemplary embodiment includes an FFT circuit 13 (Fourier transform means), IFFT circuit 14 (inverse Fourier transform means), I/Q separation circuit 15 (I/Q separation means), I/Q combination circuit 16 (I/Q combination means), first filter circuit 21 (first filter means), second filter circuit 22 (second filter means), and third filter circuit 23 (third filter means).

The digital filter circuit 10 receives a complex signal $x(n)=r(n)+js(n)$ in the time domain.

The FFT circuit 13 transforms the input complex signal $x(n)=r(n)+js(n)$ into a complex signal $X(k)=A(k)+jB(k)$ in the frequency domain by FFT, and outputs the complex signal $X(k)$ (step S1 in FIG. 2). Here, n is an integer of $0 \leq n \leq N-1$ representing a signal sample number in the time domain, k is an integer of $0 \leq k \leq N-1$ representing a frequency number in the frequency domain, and N is an integer of $0 < N$ representing the number of transform samples in FFT.

Let $R(k)$ be a complex signal in the frequency domain obtained by transforming, by real FFT, the real signal $r(n)$ in the time domain that constitutes the complex signal $x(n)=r(n)+js(n)$, and $S(k)$ be a complex signal in the frequency domain obtained by transforming a real signal $s(n)$ in the time domain by real FFT. Then, the following relation is established from complex conjugate symmetry:

$$X(k)=R(k)+jS(k) \quad (1)$$

$$X^*(N-k)=R(k)-jS(k) \quad (2)$$

where $X^*(N-k)$ is the complex conjugate of $X(N-k)$. The complex signals $R(k)$ and $S(k)$ can be obtained from $X(k)$ and $X^*(N-k)$:

$$R(k)=\tfrac{1}{2} \times \{X(k)+X^*(N-k)\} \quad (3)$$

$$jS(k)=\tfrac{1}{2} \times \{X(k)-X^*(N-k)\} \quad (4)$$

$X^*(N-k)$ is the complex conjugate of $X(N-k)$ and thus can be easily obtained from $X(N-k)$. Hence, the complex signals $R(k)$ and $S(k)$ can be obtained from $X(k)$ and $X(N-k)$.

Based on the above-described relations, the I/Q separation circuit 15 separates the complex signals $R(k)$ and $jS(k)$ from the outputs $X(k)$ and $X(N-k)$ from the FFT circuit 13 (step S2 in FIG. 2). More specifically, the I/Q separation circuit 15 receives a real part $A(k)$ and imaginary part $B(k)$ of the output $X(k)$ from the FFT circuit 13 for a frequency number k of $0 \leq k \leq N/2$. In addition, the I/Q separation circuit 15 receives a real part $A(N-k)$ and imaginary part $B(N-k)$ of the output $X(N-k)$ from the FFT circuit 13 similarly for the frequency number k of $0 \leq k \leq N/2$. The I/Q separation circuit 15 calculates the complex signals $R(k)$ and $jS(k)$:

$$R(k) = 1/2 \times \{X(k) + X^*(N-k)\} \quad (5)$$
$$= 1/2 \times \{(A(k) + A(N-k)) + j(B(k) - B(N-k))\}$$

$$jS(k) = 1/2 \times \{X(k) - X^*(N-k)\} \quad (6)$$
$$= 1/2 \times \{(A(k) - A(N-k)) + j(B(k) + B(N-k))\}$$

where $X(N)=X(0)$. From this, equations (7) and (8) are established:

$$R(0) = 1/2 \times \{X(0)X^*(N)\} \quad (7)$$
$$= 1/2 \times \{(X(0) + X^*(0)\}$$
$$= A(0)$$

$$jS(0) = 1/2 \times \{X(0) - X^*(N)\} \quad (8)$$
$$= 1/2 \times \{(X(0) - X^*(0)\}$$
$$= jB(0)$$

The I/Q separation circuit 15 outputs the complex signals $R(k)$ and $jS(k)$ calculated for the frequency number k of $0 \leq k \leq N/2$. The complex signals $R(k)$ and $jS(k)$ are calculated and output for only the frequency number k of $0 \leq k \leq N/2$ because, when $R^*(N-k)$ is defined as the complex conjugate of $R(N-k)$ and $S^*(N-k)$ is defined as the complex conjugate of $S(N-k)$ based on complex conjugate symmetry in real FFT for a real signal, the relations of the following equations (9) and (10) are established, $R(N-k)$ can be easily obtained from $R(k)$, and $jS(N-k)$ can be easily obtained from $jS(k)$:

$$R^*(N-k)=R(k) \quad (9)$$

$$S^*(N-k)=S(k) \quad (10)$$

The first filter circuit 21 is a complex filter circuit that performs filter processing by complex multiplication for the complex signal $R(k)$ output from the I/Q separation circuit 15, and a predetermined complex coefficient $V(k)$. More specifically, the first filter circuit 21 calculates and outputs a complex signal $R'(k)=R(k) \times V(k)$ for the frequency number k of $0 \leq k \leq N/2$ (step S3 in FIG. 2).

Similarly, the second filter circuit 22 is a complex filter circuit that performs filter processing by complex multiplication for the complex signal $jS(k)$ output from the I/Q separation circuit 15, and a predetermined complex coefficient $W(k)$. More specifically, the second filter circuit 22 calculates and outputs a complex signal $jS'(k)=jS(k) \times W(k)$ for the frequency number k of $0 \leq k \leq N/2$ (step S4 in FIG. 2).

The I/Q combination circuit 16 generates a complex signal $X'(k)$ by combining the complex signal $R'(k)$ output from the first filter circuit 21 and the complex signal $jS'(k)$ output from the second filter circuit 22 (step S5 in FIG. 2).

Letting $R'(k)=RI'(k)+jRQ'(k)$, $R'(N-k)=RI'(k)-jRQ'(k)$ is established because there is the relation of $R'^*(N-k)=R'(k)$ based on complex conjugate symmetry. By using this relation, the I/Q combination circuit 16 generates $R'(N-k)$ from the complex signal $R'(k)$ for the frequency number k of $0 \leq k \leq N/2$. That is, the I/Q combination circuit 16 generates $R'(k)$ at the frequency number k of $0 \leq k \leq N-1$ from $R'(k)$ input for the frequency number k of $0 \leq k \leq N/2$.

Similarly, letting $jS'(k)=SI'(k)+jSQ'(k)=j\{-jSI'(k)+SQ'(k)\}$, $jS'(N-k)=j\{jSI'(k)+SQ'(k)\}=-SI'(k)+jSQ'(k)$ is established because there is the relation of $S'^*(N-k)=S'(k)$ based on complex conjugate symmetry. By using this relation, the I/Q combination circuit 16 generates $jS'(N-k)$ from the complex signal $jS'(k)$ for the frequency number k of $0 \leq k \leq N/2$. That is, the I/Q combination circuit 16 generates $jS'(k)$ at the frequency number k of $0 \leq k \leq N-1$ from $jS'(k)$ input for the frequency number k of $0 \leq k \leq N/2$.

Then, the I/Q combination circuit 16 generates a complex signal $X'(k)=R'(k)+jS'(k)$ from the generated signals $R'(k)$ and $jS'(k)$ for the frequency number k of $0 \leq k \leq N-1$, and outputs the complex signal $X'(k)$. More specifically, the I/Q combination circuit 16 performs calculations:

$$X'(k) = R'(k) + jS'(k) \quad (11)$$
$$= \{RI'(k) + SI'(k)\} + j\{RQ'(k) + SQ'(k)\}$$

$$X'(N-k) = R'(N-k) + jS'(N-k) \quad (12)$$
$$= \{RI'(k) - SI'(k)\} - j\{RQ'(k) - SQ'(k)\}$$

The third filter circuit 23 is a complex filter circuit that performs filter processing by complex multiplication for the complex signal X'(k) output from the I/Q combination circuit 16, and a predetermined complex coefficient H(k). More specifically, the third filter circuit 23 calculates and outputs a complex signal X"(k)=X'(k)×H(k) for the frequency number k of 0≤k≤N−1 (step S6 in FIG. 2).

The IFFT circuit 14 transforms the complex signal X"(k) output from the third filter circuit 23 into a complex signal x"(n) in the time domain by IFFT for the frequency number k of 0≤k≤N−1, and outputs the complex signal x"(n) (step S7 in FIG. 2).

Figure 3:
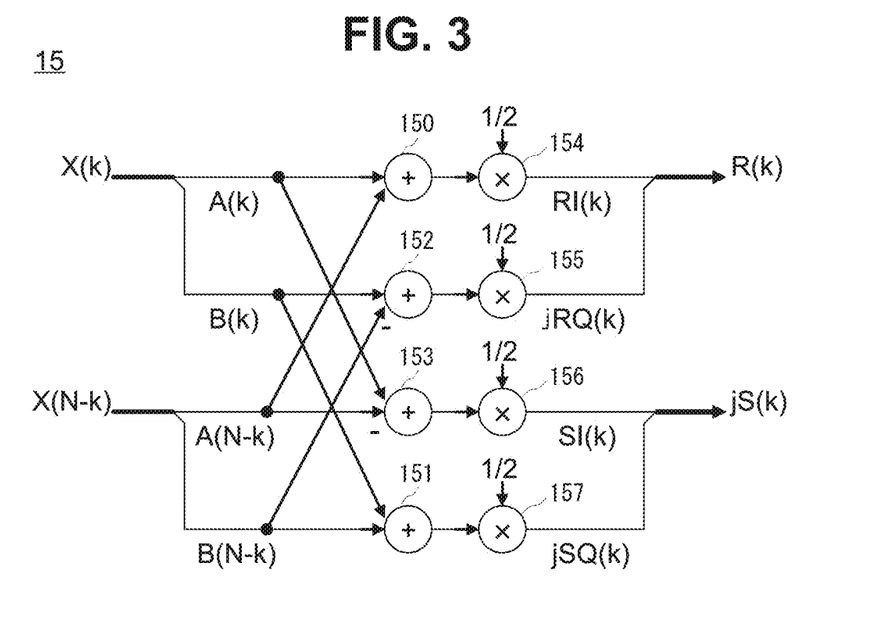
FIG. 3 is a block diagram showing the arrangement of an I/Q separation circuit according to the first exemplary embodiment of the present invention.

Next, details of the respective building components of the digital filter circuit 10 will be explained. FIG. 3 is a block diagram showing details of the arrangement of the I/Q separation circuit 15. The I/Q separation circuit 15 includes addition circuits 150 and 151, subtraction circuits 152 and 153, and multiplication circuits 154 to 157.

The addition circuit 150 (first addition means) adds the real part A(k) of the output X(k)=A(k)+jB(k) from the FFT circuit 13, and the real part A(N−k) of the output X(N−k)=A(N−k)+jB(N−k) from the FFT circuit 13. The addition circuit 151 (second addition means) adds the imaginary part jB(k) of the output X(k) from the FFT circuit 13, and the imaginary part jB(N−k) of the output X(N−k) from the FFT circuit 13. The subtraction circuit 152 (first subtraction means) subtracts, from the imaginary part jB(k) of the output X(k) from the FFT circuit 13, the imaginary part jB(N−k) of the output X(N−k) from the FFT circuit 13. The subtraction circuit 153 (second subtraction means) subtracts, from the real part A(k) of the output X(k) from the FFT circuit 13, the real part A(N−k) of the output X(N−k) from the FFT circuit 13.

The multiplication circuit 154 (first multiplication means) calculates a real part RI(k) by multiplying the output A(k)+A(N−k) from the addition circuit 150 by a predetermined coefficient of ½. The multiplication circuit 155 (second multiplication means) calculates an imaginary part jRQ(k) by multiplying the output j(B(k)−B(N−k)) from the subtraction circuit 152 by a predetermined coefficient of ½. The multiplication circuit 156 (third multiplication means) calculates a real part SI(k) by multiplying the output A(k)−A(N−k) from the subtraction circuit 153 by a predetermined coefficient of ½. The multiplication circuit 157 (fourth multiplication means) calculates an imaginary part jSQ(k) by multiplying the output j(B(k)+B(N−k)) from the subtraction circuit 151 by a predetermined coefficient of ½.

With this arrangement, the I/Q separation circuit 15 executes calculations:

$$R(k) = RI(k) + jRQ(k) \quad (13)$$
$$= 1/2 \times \{(A(k) + A(N-k)) + j(B(k) - B(N-k))\}$$

$$jS(k) = SI(k) + jSQ(k) \quad (14)$$
$$= 1/2 \times \{(A(k) - A(N-k)) + j(B(k) + B(N-k))\}$$

Figure 4:
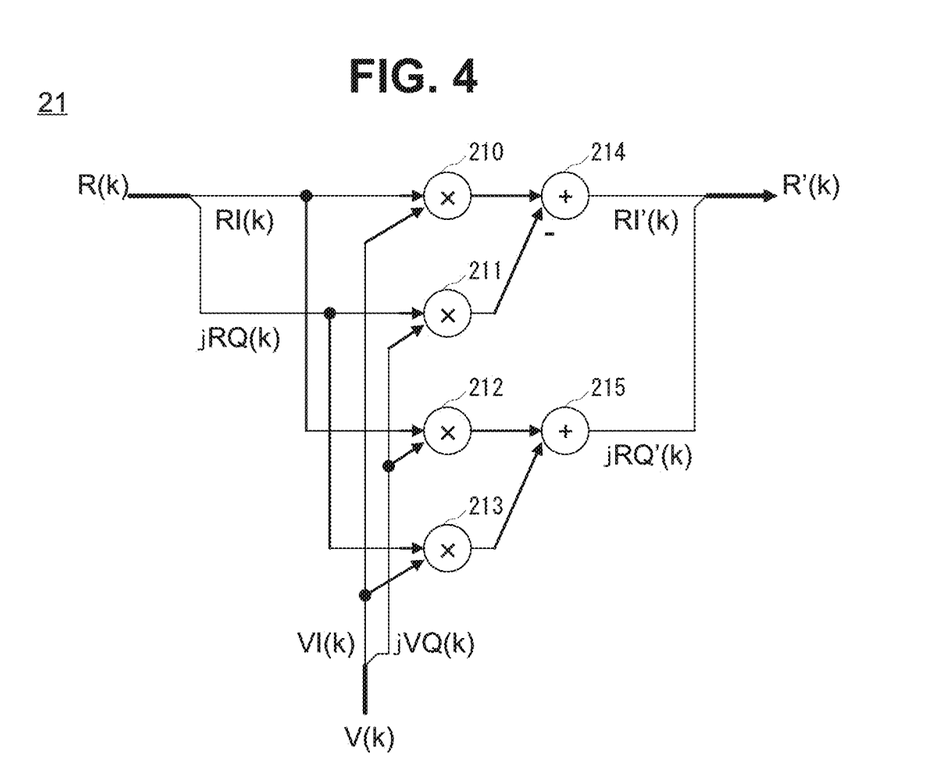
FIG. 4 is a block diagram showing the arrangement of the first filter circuit according to the first exemplary embodiment of the present invention.

FIG. 4 is a block diagram showing details of the arrangement of the first filter circuit 21. The first filter circuit 21 includes multiplication circuits 210 to 213, and addition circuits 214 and 215.

The multiplication circuit 210 (fifth multiplication means) multiplies the real part RI(k) of the output R(k)=RI(k)+jRQ(k) from the I/Q separation circuit 15, and the real part VI(k) of the predetermined complex coefficient V(k)=VI(k)+jVQ(k). The multiplication circuit 211 (sixth multiplication means) multiplies the imaginary part jRQ(k) of the output R(k) from the I/Q separation circuit 15, and the imaginary part jVQ(k) of the complex coefficient V(k). The multiplication circuit 212 (seventh multiplication means) multiplies the real part RI(k) of the output R(k) from the I/Q separation circuit 15, and the imaginary part jVQ(k) of the complex coefficient V(k). The multiplication circuit 213 (eighth multiplication means) multiplies the imaginary part jRQ(k) of the output R(k) from the I/Q separation circuit 15, and the real part VI(k) of the complex coefficient V(k).

The addition circuit 214 (third addition means) adds the output RI(k)×VI(k) from the multiplication circuit 210, and the output (−RQ(k)×VQ(k)) from the multiplication circuit 211. The addition circuit 215 (fourth addition means) adds the output RI(k)×jVQ(k) from the multiplication circuit 212, and the output jRQ(k)×VI(k) from the multiplication circuit 213.

With this arrangement, the first filter circuit 21 receives the complex signal R(k)=RI(k)+jRQ(k) output from the I/Q separation circuit 15, and the predetermined complex coefficient V(k)=VI(k)+jVQ(k), and calculates and outputs the complex signal R'(k)=RI'(k)+jRQ'(k)=R(k)×V(k).

At this time, RI'(k) and RQ'(k) are given by:

$$RI'(k) = RI(k) \times VI(k) - RQ(k) \times VQ(k) \quad (15)$$

$$RQ'(k) = RI(k) \times VQ(k) + RQ(k) \times VI(k) \quad (16)$$

Figure 5:
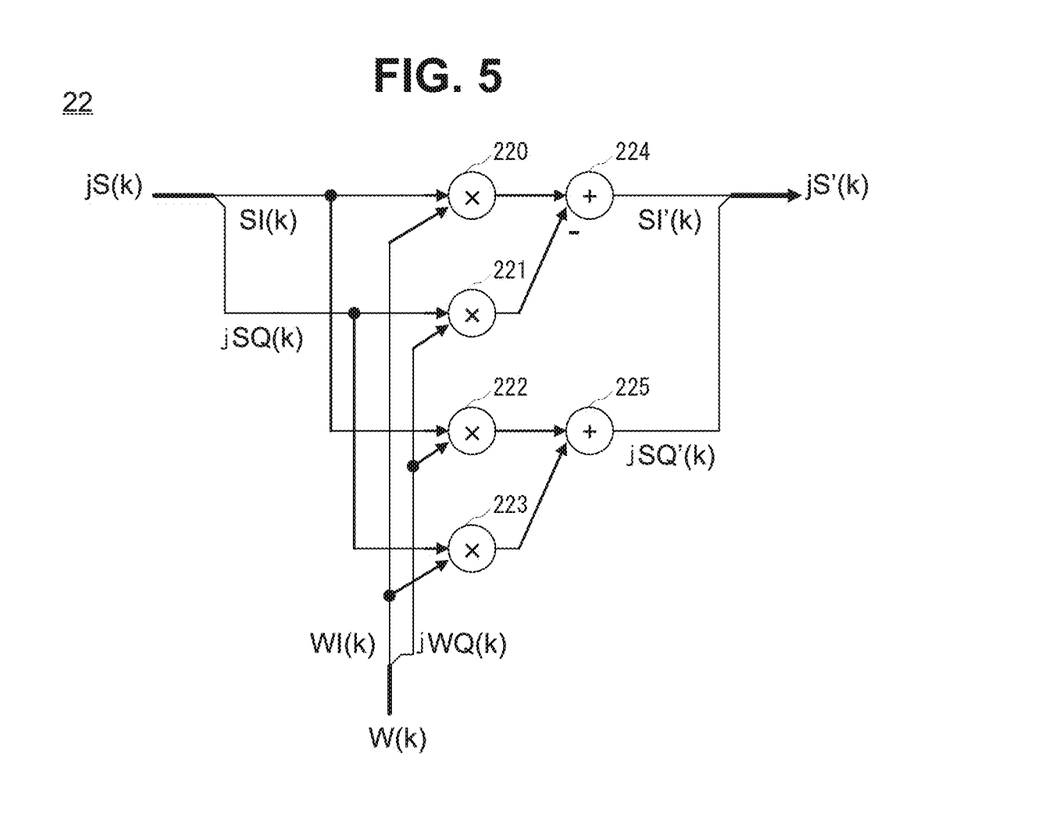
FIG. 5 is a block diagram showing the arrangement of the second filter circuit according to the first exemplary embodiment of the present invention.

FIG. 5 is a block diagram showing details of the arrangement of the second filter circuit 22. The second filter circuit 22 includes multiplication circuits 220 to 223, and addition circuits 224 and 225.

The multiplication circuit 220 (ninth multiplication means) multiplies the real part SI(k) of the output jS(k)=SI(k)+jSQ(k) from the I/Q separation circuit 15, and the real part WI(k) of the predetermined complex coefficient W(k)=WI(k)+jWQ(k). The multiplication circuit 221 (10th multiplication means) multiplies the imaginary part jSQ(k) of the output jS(k) from the I/Q separation circuit 15, and the imaginary part jWQ(k) of the complex coefficient W(k). The multiplication circuit 222 (11th multiplication means) multiplies the real part SI(k) of the output jS(k) from the I/Q separation circuit 15, and the imaginary part jWQ(k) of the complex coefficient W(k). The multiplication circuit 223 (12th multiplication means) multiplies the imaginary part jSQ(k) of the output jS(k) from the I/Q separation circuit 15, and the real part WI(k) of the complex coefficient W(k).

The addition circuit 224 (fifth addition means) adds the output SI(k)×WI(k) from the multiplication circuit 220, and the output (−SQ(k)×WQ(k)) from the multiplication circuit 221. The addition circuit 225 (sixth addition means) adds the output SI(k)×jWQ(k) from the multiplication circuit 222, and the output jSQ(k)×WI(k) from the multiplication circuit 223.

With this arrangement, the second filter circuit 22 receives the complex signal jS(k)=SI(k)+jSQ(k) output from the I/Q separation circuit 15, and the predetermined complex coefficient W(k)=WI(k)+jWQ(k), and calculates and outputs the complex signal jS'(k)=SI'(k)+jSQ'(k)=jS(k)×W(k).

At this time, SI'(k) and SQ'(k) are given by:

$$SI'(k)=SI(k) \times WI(k)-SQ(k) \times WQ(k) \tag{17}$$

$$SQ'(k)=SI(k) \times WQ(k)+SQ(k) \times WI(k) \tag{18}$$

Figure 6:
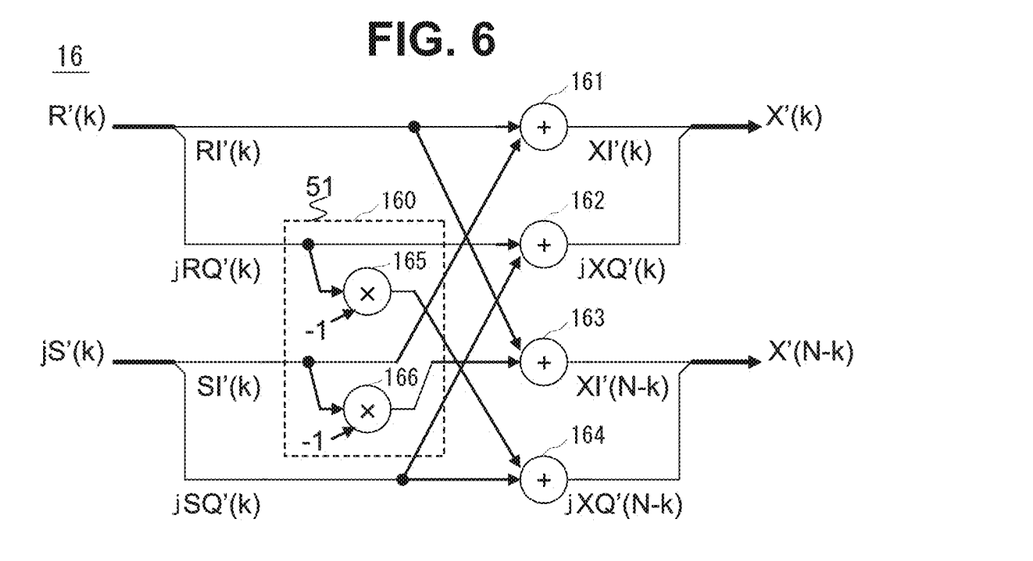
FIG. 6 is a block diagram showing the arrangement of an I/Q combination circuit according to the first exemplary embodiment of the present invention.

FIG. 6 is a block diagram showing details of the arrangement of the I/Q combination circuit 16. The I/Q combination circuit 16 includes a complex conjugate generation circuit 160, and addition circuits 161 to 164. The complex conjugate generation circuit 160 includes two, (−1) multiplication circuits 165 and 166.

The (−1) multiplication circuit 165 (13th multiplication means) multiplies the imaginary part jRQ'(k) of the output R'(k)=RI'(k)+jRQ'(k) from the first filter circuit 21, and a coefficient (−1). The (−1) multiplication circuit 166 (14th multiplication means) multiplies the real part SI'(k) of the output jS'(k)=SI'(k)+jSQ'(k) from the second filter circuit 22, and a coefficient (−1).

The addition circuit 161 (seventh addition means) adds the real part RI'(k) of the output R'(k) from the first filter circuit 21, and the real part SI'(k) of the output jS'(k) from the second filter circuit 22. The addition circuit 162 (eighth addition means) adds the imaginary part jRQ'(k) of the output R'(k) from the first filter circuit 21, and the imaginary part jSQ'(k) of the output jS'(k) from the second filter circuit 22. The addition circuit 163 (ninth addition means) adds the real part RI'(k) of the output R'(k) from the first filter circuit 21, and an output (−SI'(k)) from the (−1) multiplication circuit 166. The addition circuit 164 (10th addition means) adds an output (−jRQ'(k)) from the (−1) multiplication circuit 165, and the imaginary part jSQ'(k) of the output jS'(k) from the second filter circuit 22.

As described above, the I/Q combination circuit 16 receives the complex signal R'(k)=RI'(k)+jRQ'(k) output from the first filter circuit 21 for the frequency number k of 0≤k≤N/2, and the complex signal jS'(k)=SI'(k)+jSQ'(k) output from the second filter circuit 22 for the frequency number k of ≤k≤N/2.

Then, the I/Q combination circuit 16 calculates a complex signal X'(k)=XI'(k)+jXQ'(k)=R'(k)+jS'(k) from the complex signals R'(k) and jS'(k) for the frequency number k of 0≤k≤N/2, and outputs the complex signal X'(k). At this time, XI'(k) and XQ'(k) are given by:

$$XI'(k)=RI'(k)+SI'(k) \tag{19}$$

$$XQ'(k)=RQ'(k)+SQ'(k) \tag{20}$$

Also, the I/Q combination circuit 16 generates, by the complex conjugate generation circuit 160, complex signals R'(N−k) and jS'(N−k) from the complex signals R'(k) and jS'(k) for the frequency number k of 0≤k≤N/2:

$$R'(N-k)=RI'(k)-jRQ'(k) \tag{21}$$

$$jS'(N-k)=-SI'(k)+jSQ'(k) \tag{22}$$

Then, the I/Q combination circuit 16 calculates a complex signal X'(N−k)=XI'(N−k)+jXQ'(N−k)=R'(N−k)+jS'(N−k) from the generated signals R'(N−k) and jS'(N−k) for the frequency number k of 0≤k≤N/2, and outputs the complex signal X'(N−k). At this time, XI'(N−k) and XQ'(N−k) are given by:

$$XI'(N-k)=RI'(N-k)-SI'(N-k) \tag{23}$$

$$XQ'(N-k)=-RQ'(N-k)+SQ'(N-k) \tag{24}$$

Figure 7:
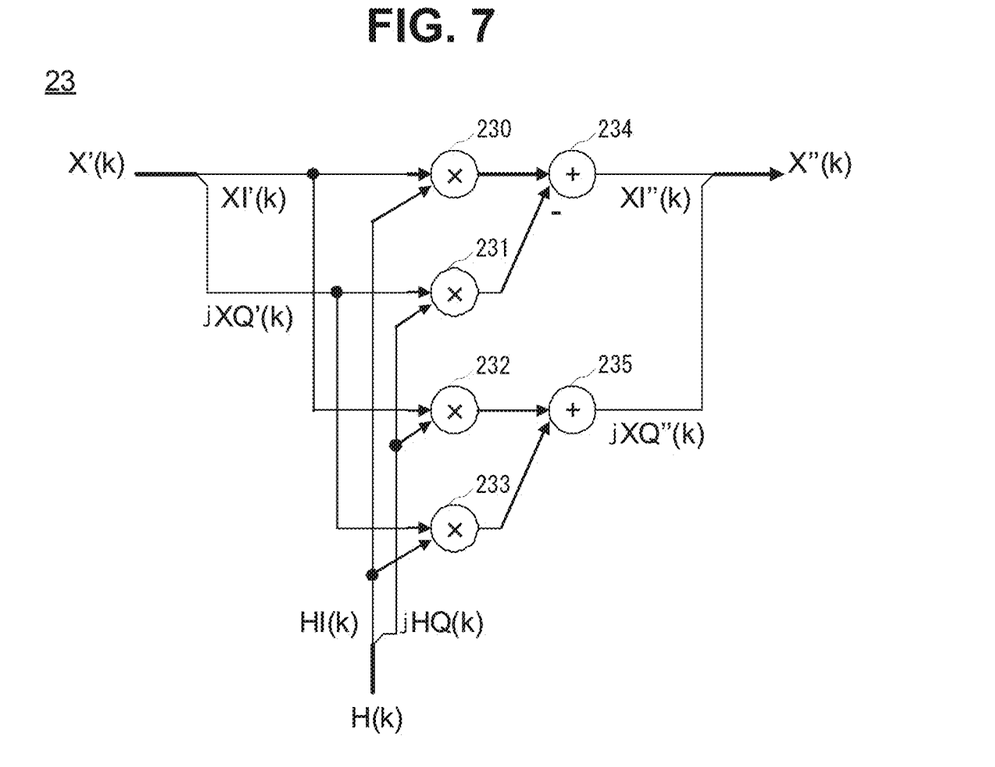
FIG. 7 is a block diagram showing the arrangement of the third filter circuit according to the first exemplary embodiment of the present invention.

FIG. 7 is a block diagram showing details of the arrangement of the third filter circuit 23. The third filter circuit 23 includes multiplication circuits 230 to 233, and addition circuits 234 and 235.

The multiplication circuit 230 (15th multiplication means) multiplies the real part XI'(k) of the output X'(k)=XI'(k)+jXQ'(k) from the I/Q combination circuit 16, and the real part HI(k) of the predetermined complex coefficient H(k)=HI(k)+jHQ(k). The multiplication circuit 231 (16th multiplication means) multiplies the imaginary part jXQ'(k) of the output X'(k) from the I/Q combination circuit 16, and the imaginary part jHQ(k) of the complex coefficient H(k). The multiplication circuit 232 (17th multiplication means) multiplies the real part XI'(k) of the output X'(k) from the I/Q combination circuit 16, and the imaginary part jHQ(k) of the complex coefficient H(k). The multiplication circuit 233 (18th multiplication means) multiplies the imaginary part jXQ'(k) of the output X'(k) from the I/Q combination circuit 16, and the real part HI(k) of the complex coefficient H(k).

The addition circuit 234 (11th addition means) adds the output XI'(k)×HI(k) from the multiplication circuit 230, and the output (−XQ'(k)×HQ(k)) from the multiplication circuit 231. The addition circuit 235 (12th addition means) adds the output XI'(k)×jHQ(k) from the multiplication circuit 232, and the output jXQ'(k)×HI(k) from the multiplication circuit 233.

With this arrangement, the third filter circuit 23 receives the complex signal X'(k)=XI'(k)+jXQ'(k) output from the I/Q combination circuit 16, and the predetermined complex coefficient H(k)=HI(k)+jHQ(k), and calculates and outputs the complex signal X"(k)=XI"(k)+jXQ"(k)=X'(k)×H(k).

At this time, XI"(k) and XQ"(k) are given by:

$$XI''(k)=XI'(k) \times HI(k)-XQ'(k) \times HQ(k) \tag{25}$$

$$XQ''(k)=XI'(k) \times HQ(k)+XQ'(k) \times HI(k) \tag{26}$$

[Effects of First Exemplary Embodiment]

In the exemplary embodiment, the I/Q separation circuit 15 separates the complex signal X(k) obtained by performing complex fast Fourier transform on the complex signal x(n)=r(n)+js(n), into R(k) serving as the result of FFT on the real part r(n) of x(n), and jS(k) serving as the result of FFT on the imaginary part js(n) of x(n). Thus, filter processing can be performed independently on the respective complex signals R(k) and jS(k). Further, the I/Q combination circuit 16 combines, into the complex signal X'(k), the complex signals R'(k) and jS'(k) serving as the results of performing filter processing independently on the respective complex signals R(k) and jS(k). Hence, filter processing can be performed on the combined complex signal X'(k).

According to the exemplary embodiment, one FFT circuit 13 and one IFFT circuit 14 can implement filter processing in the frequency domain that corresponds to a total of three filter processes: independent filter processes by real number calculation on the respective real and imaginary parts of a complex signal in the time domain, and a filter process by complex number calculation on a complex signal obtained as a result of these two filter processes. This obviates the need to arrange FFT circuits and IFFT circuits for the respective three filter processes. As a result, the exemplary embodiment can reduce the circuit scale and power consumption when the digital filter circuit is mounted in an LSI, compared to the digital filter circuit according to the technique disclosed in Japanese Patent Laid-Open No. 2011-4264.

In the exemplary embodiment, letting N (N is an integer of N>0) be the number of transform samples in FFT, the I/Q separation circuit 15 separates the complex signal X(k) into R(k) serving as the result of FFT on the real part r(n) of x(n), and S(k) serving as the result of FFT on the imaginary part s(n) of x(n) for only the frequency number k of $0 \leq k \leq N/2$. Further, the I/Q combination circuit 16 generates R'(k) at the frequency number k of $0 \leq k \leq N-1$ from the complex signal R'(k) that is output from the first filter circuit 21 for the frequency number k of $0 \leq k \leq N/2$. Similarly, the I/Q combination circuit 16 generates S'(k) at the frequency number k of $0 \leq k \leq N-1$ from the complex signal S'(k) that is output from the second filter circuit 22 for the frequency number k of $0 \leq k \leq N/2$.

Therefore, the first filter circuit 21 and second filter circuit 22 suffice to perform filter processing for only the frequency number k of $0 \leq k \leq N/2$. As a result, the exemplary embodiment can reduce the circuit scale and power consumption when the digital filter circuit is mounted in an LSI.

[Second Exemplary Embodiment]

The first exemplary embodiment has explained a case in which the digital filter circuit 10 is implemented by hardware. However, the digital filter circuit 10 can also be implemented by a computer including a CPU, a memory, and an interface with the outside, and a program for controlling these hardware resources.

Figure 8:
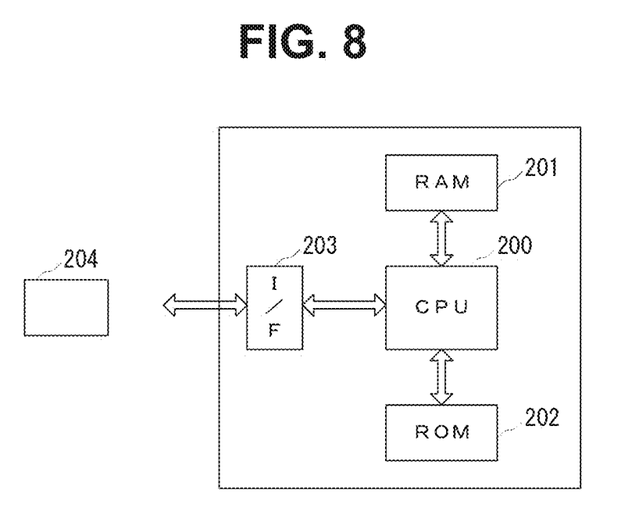
FIG. 8 is a block diagram showing an example of the arrangement of a computer according to the second exemplary embodiment of the present invention.

FIG. 8 is a block diagram showing an example of the arrangement of such a computer. In FIG. 8, reference numeral 200 denotes a CPU; 201, a RAM; 202, a ROM; and 203, an interface.

In this computer, a digital filter program for implementing a digital filter processing method according to the present invention is provided in a state in which it is recorded on a computer-readable non-transitory recording medium 204 such as a flexible disk, CD-ROM, DVD-ROM, or memory card. The program is stored in a memory such as the RAM 201 or an external hard disk device. In accordance with the stored program, the CPU 200 executes the processing described in the first exemplary embodiment.

Part or all of the above-described exemplary embodiments can also be described as in the following supplementary notes, but is not limited to them.

(Supplementary Note 1) There is provided a digital filter circuit comprising Fourier transform means for transforming a complex signal in a time domain into a signal in a frequency domain by Fourier transform, I/Q separation means for separating the signal in the frequency domain transformed by the Fourier transform means into a signal in a first frequency domain that corresponds to a real part of the complex signal in the time domain, and a signal in a second frequency domain that corresponds to an imaginary part of the complex signal in the time domain, first filter means for performing filter processing on the signal in the first frequency domain, second filter means for performing filter processing on the signal in the second frequency domain, I/Q combination means for combining the signal having undergone the filter processing by the first filter means and the signal having undergone the filter processing by the second filter means, thereby generating a signal in a third frequency domain, third filter means for performing filter processing on the signal in the third frequency domain, and inverse Fourier transform means for transforming the signal having undergone the filter processing by the third filter means into a signal in the time domain by inverse Fourier transform.

(Supplementary Note 2) There is provided a digital filter circuit according to supplementary note 1, wherein letting N be the number of transform samples in the Fourier transform, the I/Q separation means includes means for generating a signal in the first frequency domain and a signal in the second frequency domain for a frequency number k in a range of $0 \leq k \leq N/2$, the first filter means includes means for performing filter processing on the signal in the first frequency domain for the frequency number k in the range of $0 \leq k \leq N/2$, the second filter means includes means for performing filter processing on the signal in the second frequency domain for the frequency number k in the range of $0 \leq k \leq N/2$, and the I/Q combination means includes means for generating a signal in the third frequency domain for a frequency number k in a range of $0 \leq k \leq N-1$ from the signal having undergone the filter processing by the first filter means and the signal having undergone the filter processing by the second filter means for the frequency number k in the range $0 \leq k \leq N/2$.

(Supplementary Note 3) There is provided a digital filter circuit according to supplementary note 2, wherein the I/Q separation means includes first addition means for adding a real part of an output X(k) from the Fourier transform means and a real part of an output X(N−k) from the Fourier transform means, second addition means for adding an imaginary part of the output X(k) from the Fourier transform means and an imaginary part of the output X(N−k) from the Fourier transform means, first subtraction means for subtracting, from the imaginary part of the output X(k) from the Fourier transform means, the imaginary part of the output X(N−k) from the Fourier transform means, second subtraction means for subtracting, from the real part of the output X(k) from the Fourier transform means, the real part of the output X(N−k) from the Fourier transform means, first multiplication means for multiplying an output from the first addition means by a predetermined coefficient of ½, second multiplication means for multiplying an output from the first subtraction means by the predetermined coefficient of ½, third multiplication means for multiplying an output from the second subtraction means by the predetermined coefficient of ½, and fourth multiplication means for multiplying an output from the second addition means by the predetermined coefficient of ½.

(Supplementary Note 4) There is provided a digital filter circuit according to supplementary note 2, wherein the first filter means includes fifth multiplication means for multiplying a real part of an output R(k) from the I/Q separation means and a real part of a predetermined complex coefficient V(k), sixth multiplication means for multiplying an imaginary part of the output R(k) from the I/Q separation means and an imaginary part of the complex coefficient V(k), seventh multiplication means for multiplying the real part of the output R(k) from the I/Q separation means and the imaginary part of the complex coefficient V(k), eighth multiplication means for multiplying the imaginary part of the output R(k) from the I/Q separation means and the real part of the complex coefficient V(k), third addition means for adding an output from the fifth multiplication means and an output from the sixth multiplication means, and fourth addition means for adding an output from the seventh multiplication means and an output from the eighth multiplication means.

(Supplementary Note 5) There is provided a digital filter circuit according to supplementary note 2, wherein the second filter means includes ninth multiplication means for multiplying a real part of an output jS(k) from the I/Q separation means and a real part of a predetermined complex coefficient W(k), 10th multiplication means for multiplying an imaginary part of the output jS(k) from the I/Q separation means and an imaginary part of the complex coefficient W(k), 11th multiplication means for multiplying the real part of the output jS(k) from the I/Q separation means and the imaginary part of the complex coefficient W(k), 12th multiplication means for multiplying the imaginary part of the output jS(k) from the I/Q separation means and the real part of the complex coefficient W(k), fifth addition means for adding an output from the ninth multiplication means and an output from the 10th multiplication means, and sixth addition means for adding an output from the 11th multiplication means and an output from the 12th multiplication means.

(Supplementary Note 6) There is provided a digital filter circuit according to supplementary note 2, wherein the I/Q combination means includes 13th multiplication means for multiplying an imaginary part of an output R'(k) from the first filter means and a predetermined coefficient of −1, 14th multiplication means for multiplying a real part of an output jS'(k) from the second filter means and the predetermined coefficient of −1, seventh addition means for adding a real part of the output R'(k) from the first filter means and the real part of the output jS'(k) from the second filter means, eighth addition means for adding the imaginary part of the output R'(k) from the first filter means and an imaginary part of the output jS'(k) from the second filter means, ninth addition means for adding the real part of the output R'(k) from the first filter means and an output from the 14th multiplication means, and 10th addition means for adding an output from the 13th multiplication means and the imaginary part of the output jS'(k) from the second filter means.

(Supplementary Note 7) There is provided a digital filter circuit according to supplementary note 2, wherein the third filter means includes 15th multiplication means for multiplying a real part of an output X'(k) from the I/Q combination means and a real part of a predetermined complex coefficient H(k), 16th multiplication means for multiplying an imaginary part of the output X'(k) from the I/Q combination means and an imaginary part of the complex coefficient H(k), 17th multiplication means for multiplying the real part of the output X'(k) from the I/Q combination means and the imaginary part of the complex coefficient H(k), 18th multiplication means for multiplying the imaginary part of the output X'(k) from the I/Q combination means and the real part of the complex coefficient H(k), 11th addition means for adding an output from the 15th multiplication means and an output from the 16th multiplication means, and 12th addition means for adding an output from the 17th multiplication means and an output from the 18th multiplication means.

(Supplementary Note 8) There is provided a digital filter processing method comprising a Fourier transform step of transforming a complex signal in a time domain into a signal in a frequency domain by Fourier transform, an I/Q separation step of separating the signal in the frequency domain transformed in the Fourier transform step into a signal in a first frequency domain that corresponds to a real part of the complex signal in the time domain, and a signal in a second frequency domain that corresponds to an imaginary part of the complex signal in the time domain, a first filter step of performing filter processing on the signal in the first frequency domain, a second filter step of performing filter processing on the signal in the second frequency domain, an I/Q combination step of combining the signal having undergone the filter processing in the first filter step and the signal having undergone the filter processing in the second filter step, thereby generating a signal in a third frequency domain, a third filter step of performing filter processing on the signal in the third frequency domain, and an inverse Fourier transform step of transforming the signal having undergone the filter processing in the third filter step into a signal in the time domain by inverse Fourier transform.

(Supplementary Note 9) There is provided a digital filter processing method according to supplementary note 8, wherein letting N be the number of transform samples in the Fourier transform, the I/Q separation step includes a step of generating a signal in the first frequency domain and a signal in the second frequency domain for a frequency number k in a range of $0 \le k \le N/2$, the first filter step includes a step of performing filter processing on the signal in the first frequency domain for the frequency number k in the range of $0 \le k \le N/2$, the second filter step includes a step of performing filter processing on the signal in the second frequency domain for the frequency number k in the range of $0 \le k \le N/2$, and the I/Q combination step includes a step of generating a signal in the third frequency domain for a frequency number k in a range of $0 \le k \le N-1$ from the signal having undergone the filter processing in the first filter step and the signal having undergone the filter processing in the second filter step for the frequency number k in the range of $0 \le k \le N/2$.

The present invention has been explained with reference to the above-described exemplary embodiments, but is not limited to the above-described exemplary embodiments. The above-described exemplary embodiments may be appropriately combined and used, and the arrangement and details of the present invention may be appropriately changed without departing from the scope of the invention.

This application is based upon and claims the benefit of priority from Japanese Patent Application No. 2011-278254, filed on Dec. 20, 2011, the disclosure of which is incorporated herein in its entirety by reference.

INDUSTRIAL APPLICABILITY

The present invention is applicable to a digital filter.

EXPLANATION OF THE REFERENCE
NUMERALS AND SIGNS

10 . . . digital filter circuit, 13 . . . FFT circuit, 14 . . . IFFT circuit, 15 . . . I/Q separation circuit, 16 . . . I/Q combination circuit, 21, 22, 23 . . . filter circuit, 150, 151, 161-164, 214, 215, 224, 225, 234, 235 . . . addition circuit, 152, 153 . . . subtraction circuit, 154-157, 165, 166, 210-213, 220-223, 230-233 . . . multiplication circuit, 160 . . . complex conjugate generation circuit, 200 . . . CPU, 201 . . . RAM, 202 . . . ROM, 203 . . . interface

The invention claimed is:

1. A digital filter circuit comprising:
a fast Fourier transform circuit configured to transform a complex signal in a time domain into a signal in a frequency domain by Fourier transform;
an I/Q separation circuit configured to separate the signal in the frequency domain transformed by said fast Fourier transform circuit into a signal in a first frequency domain that corresponds to a real part of the complex signal in the time domain, and a signal in a second frequency domain that corresponds to an imaginary part of the complex signal in the time domain;
a first filter circuit configured to perform filter processing on the signal in the first frequency domain;
a second filter circuit configured to perform filter processing on the signal in the second frequency domain;
an I/Q combination circuit configured to combine the signal having undergone the filter processing by said first filter circuit and the signal having undergone the filter processing by said second filter circuit, thereby generating a signal in a third frequency domain;

a third filter circuit configured to perform filter processing on the signal in the third frequency domain; and an inverse fast Fourier transform circuit configured to transform the signal having undergone the filter processing by said third filter circuit into a signal in the time domain by inverse Fourier transform.

2. A digital filter circuit according to claim 1, wherein letting N be the number of transform samples in the Fourier transform, said I/Q separation circuit is configured to generate a signal in the first frequency domain and a signal in the second frequency domain for a frequency number k in a range of 0≤k≤N/2, said first filter circuit is configured to perform filter processing on the signal in the first frequency domain for the frequency number k in the range of 0≤k≤N/2, said second filter circuit is configured to perform filter processing on the signal in the second frequency domain for the frequency number k in the range of 0≤k≤N/2, and said I/Q combination circuit is configured to generate a signal in the third frequency domain for a frequency number k in a range of 0≤k≤N−1 from the signal having undergone the filter processing by said first filter circuit and the signal having undergone the filter processing by said second filter circuit for the frequency number k in the range 0≤k≤N/2.

3. A digital filter circuit according to claim 2, wherein said I/Q separation circuit includes:

a first addition circuit configured to add a real part of an output X(k) from said fast Fourier transform circuit and a real part of an output X(N−k) from said fast Fourier transform circuit;

a second addition circuit configured to add an imaginary part of the output X(k) from said fast Fourier transform circuit and an imaginary part of the output X(N−k) from said fast Fourier transform circuit;

a first subtraction circuit configured to subtract, from the imaginary part of the output X(k) from said fast Fourier transform circuit, the imaginary part of the output X(N−k) from said fast Fourier transform circuit;

a second subtraction circuit configured to subtract, from the real part of the output X(k) from said fast Fourier transform circuit, the real part of the output X(N−k) from said fast Fourier transform circuit;

a first multiplication circuit configured to multiply an output from said first addition circuit by a predetermined coefficient of ½;

a second multiplication circuit configured to multiply an output from said first subtraction circuit by the predetermined coefficient of ½;

a third multiplication circuit configured to multiply an output from said second subtraction circuit by the predetermined coefficient of ½; and a fourth multiplication circuit configured to multiply an output from said second addition circuit by the predetermined coefficient of ½.

4. A digital filter circuit according to claim 2, wherein said first filter circuit includes:

a fifth multiplication circuit configured to multiply a real part of an output R(k) from said I/Q separation circuit and a real part of a predetermined complex coefficient V(k);

a sixth multiplication circuit configured to multiply an imaginary part of the output R(k) from said I/Q separation circuit and an imaginary part of the complex coefficient V(k);

a seventh multiplication circuit configured to multiply the real part of the output R(k) from said I/Q separation circuit and the imaginary part of the complex coefficient V(k);

an eighth multiplication circuit configured to multiply the imaginary part of the output R(k) from said I/Q separation circuit and the real part of the complex coefficient V(k);

a third addition circuit configured to add an output from said fifth multiplication circuit and an output from said sixth multiplication circuit; and a fourth addition circuit configured to add an output from said seventh multiplication circuit and an output from said eighth multiplication circuit.

5. A digital filter circuit according to claim 2, wherein said second filter circuit includes:

a ninth multiplication circuit configured to multiply a real part of an output jS(k) from said I/Q separation circuit and a real part of a predetermined complex coefficient W(k);

a 10th multiplication circuit configured to multiply an imaginary part of the output jS(k) from said I/Q separation circuit and an imaginary part of the complex coefficient W(k);

a 11th multiplication circuit configured to multiply the real part of the output jS(k) from said I/Q separation circuit and the imaginary part of the complex coefficient W(k);

a 12th multiplication circuit configured to multiply the imaginary part of the output jS(k) from said I/Q separation circuit and the real part of the complex coefficient W(k);

a fifth addition circuit configured to add an output from said ninth multiplication circuit and an output from said 10th multiplication circuit; and a sixth addition circuit configured to add an output from said 11th multiplication circuit and an output from said 12th multiplication circuit.

6. A digital filter circuit according to claim 2, wherein said I/Q combination circuit includes:

a 13th multiplication circuit configured to multiply an imaginary part of an output R'(k) from said first filter circuit and a predetermined coefficient of −1;

a 14th multiplication circuit configured to multiply a real part of an output jS'(k) from said second filter circuit and the predetermined coefficient of −1;

a seventh addition circuit configured to add a real part of the output R'(k) from said first filter circuit and the real part of the output jS'(k) from said second filter circuit;

an eighth addition circuit configured to add the imaginary part of the output R'(k) from said first filter circuit and an imaginary part of the output jS'(k) from said second filter circuit;

a ninth addition circuit configured to add the real part of the output R'(k) from said first filter circuit and an output from said 14th multiplication circuit; and a 10th addition circuit configured to add an output from said 13th multiplication circuit and the imaginary part of the output jS'(k) from said second filter circuit.

7. A digital filter circuit according to claim 2, wherein said third filter circuit includes:

a 15th multiplication circuit configured to multiply a real part of an output X'(k) from said I/Q combination circuit and a real part of a predetermined complex coefficient H(k);

a 16th multiplication circuit configured to multiply an imaginary part of the output X'(k) from said I/Q combination circuit and an imaginary part of the complex coefficient H(k);

a 17th multiplication circuit configured to multiply the real part of the output X'(k) from said I/Q combination circuit and the imaginary part of the complex coefficient H(k);

a 18th multiplication circuit configured to multiply the imaginary part of the output X'(k) from said I/Q combination circuit and the real part of the complex coefficient H(k);

a 11th addition circuit configured to add an output from said 15th multiplication circuit and an output from said 16th multiplication circuit; and a 12th addition circuit configured to add an output from said 17th multiplication circuit and an output from said 18th multiplication circuit.

8. A digital filter processing method comprising:

transforming, by a fast Fourier transform circuit, a complex signal in a time domain into a signal in a frequency domain by Fourier transform;

separating, by an I/Q separation circuit, the signal in the frequency domain transformed by the fast Fourier transform circuit into a signal in a first frequency domain that corresponds to a real part of the complex signal in the time domain, and a signal in a second frequency domain that corresponds to an imaginary part of the complex signal in the time domain;

performing, by a first filter circuit, first filter processing on the signal in the first frequency domain;

performing, by a second filter circuit, second filter processing on the signal in the second frequency domain;

combining, by an I/Q combination circuit, the signal having undergone the first filter processing and the signal having undergone the second filter processing, thereby generating a signal in a third frequency domain;

performing, by a third filter circuit, third filter processing on the signal in the third frequency domain; and transforming, by an inverse fast Fourier transform circuit, the signal having undergone the third filter processing into a signal in the time domain by inverse Fourier transform.

9. A digital filter processing method according to claim 8, wherein, letting N be the number of transform samples in the Fourier transform, the separating comprises generating, by the I/Q separation circuit, a signal in the first frequency domain and a signal in the second frequency domain for a frequency number k in a range of $0 \leq k \leq N/2$, the performing first filter processing comprises performing, by the first filter circuit, the first filter processing on the signal in the first frequency domain for the frequency number k in the range of $0 \leq k \leq N/2$, the performing first filter processing comprises performing, by the second filter circuit, the second filter processing on the signal in the second frequency domain for the frequency number k in the range of $0 \leq k \leq N/2$, and the combining comprises generating, by the I/Q combination circuit, a signal in the third frequency domain for a frequency number k in a range of $0 \leq k \leq N-1$ from the signal having undergone the first filter processing and the signal having undergone the second filter processing for the frequency number k in the range of $0 \leq k \leq N/2$.

* * * * *